(12) United States Patent
Lester et al.

(10) Patent No.: US 10,521,527 B2
(45) Date of Patent: *Dec. 31, 2019

(54) MODELING AND ANALYSIS OF LEADING EDGE RIBS OF AN AIRCRAFT WING

(71) Applicant: THE BOEING COMPANY, Chicago, IL (US)

(72) Inventors: Eric S. Lester, Edmonds, WA (US); Michael A. O'Grady, Woodinville, WA (US); Alan N. Baumgarten, Seatlle, WA (US); Navin Kumar, Mukilteo, WA (US); Venkata Narasimha Ravi Udali, Bothell, WA (US); Sachin Kulshrestha, Mysore (IN); Tejoram Bhagavathula, Everett, WA (US)

(73) Assignee: The Boeing Company, Chicago, IL (US)

( * ) Notice: Subject to any disclaimer, the term of this patent is extended or adjusted under 35 U.S.C. 154(b) by 571 days.

This patent is subject to a terminal disclaimer.

(21) Appl. No.: 15/191,823

(22) Filed: Jun. 24, 2016

(65) Prior Publication Data

US 2017/0371989 A1 Dec. 28, 2017

(51) Int. Cl.
*G06F 17/50* (2006.01)
*B64C 3/18* (2006.01)
(Continued)

(52) U.S. Cl.
CPC .......... *G06F 17/5018* (2013.01); *B64C 3/187* (2013.01); *B64C 3/28* (2013.01); *B64F 5/00* (2013.01); *G06F 17/5095* (2013.01)

(58) Field of Classification Search
CPC ............. G06F 17/5018; G06F 17/5095; G06F 2217/16; B64C 3/187; B64C 3/28; B64F 5/00

See application file for complete search history.

(56) References Cited

U.S. PATENT DOCUMENTS

| 6,799,463 | B2 * | 10/2004 | Fields ................. G06F 17/5018 |
|           |      |         | 702/42 |
| 7,889,840 | B2 * | 2/2011  | Vasudevan ................ B64F 5/60 |
|           |      |         | 378/210 |
| 8,301,417 | B2 * | 10/2012 | Hu .......................... G06F 17/50 |
|           |      |         | 703/1 |
| 2016/0107743 | A1 | 4/2016 | Seack |
| 2017/0370808 | A1 * | 12/2017 | Lester ..................... B64C 3/187 |

OTHER PUBLICATIONS

Extended European Search Report dated Oct. 23, 2017 in European Application No. 17166886.6.
(Continued)

*Primary Examiner* — Doon Y Chow
*Assistant Examiner* — Kimberly L Jordan
(74) *Attorney, Agent, or Firm* — Womble Bond Dickinson (US) LLP

(57) ABSTRACT

An apparatus is provided for analysis of a leading edge rib of a fixed leading edge section of an aircraft wing. The apparatus may identify geometric or inertial properties of a plurality of stiffeners of the rib, and based thereon perform an analysis to predict a failure rate of the leading edge rib under an external load. From the failure rate, the apparatus may determine a structural integrity of the leading edge rib under the external load. Performing the analysis may include importing a plurality of section cuts into a finite element model of the rib and thereby identifying nodes proximate the section cuts. Under an external load, internal load distributions may be extracted from elements proximate the nodes and elements, and the failure rate of the leading edge rib under the external load may be predicted based on the internal load distributions of the elements.

27 Claims, 13 Drawing Sheets

(51) Int. Cl.
*B64C 3/28* (2006.01)
*B64F 5/00* (2017.01)

(56) References Cited

OTHER PUBLICATIONS

Ainsworth, J., et al., "Airfraim Wingbox Preliminary Design and Weight Prediction", 69th Annual Conference, Virginia Beach, VA, May 1, 2010, pp. 1-41, XP055377257, retrieved May 30, 2017 from https://hypersizer.com/download.php?type=pdf&file=SAWE2010_Airframe_Wing_Box_Structure_Weight_Predictions.pdf.

Krog, L., et al., "Application of topology, sizing and shape optimization methods to optimal design of aircraft components", Jan. 1, 2002, pp. 1-12, XP055377263, retrieved May 30, 2017 from http://www.southampton.ac.ukhjps7/AircraftcY020Design%20Resources/manufacturing/airbus%20wing%2Orib%20design.pdf.

Arsenyeva, A. et al., "Efficient and adaptive parametric modeling for shape optimization of a wingbox", YIC GACM 2015 3rd ECCOMAS Young Investigators Conference 6th GACM Colloquium, Jul. 23, 2015, pp. 2-6, X055377546, retrieved May 30, 2017 from https://www.researchgate.net/profile/Anna_Arsenyeva/publication/280557241_Efficient_and_adaptive_parametric_modeling_for_shape_optimization_of_a_wingbox/links/55b8f84408aec0e5f4313f906.pdf.

Hardee Edwin et al. "CAD-based design parameterization for shape optimization of elastic solids", Advances in Engineering Software, Elsevier Science, Oxford, GB, vol. 30, No. 3, Mar. 1, 1999 (Mar. 1, 1999), pp. 185-199, XP002418120, ISSN: 0965-9978, DOI: 10.1016/S0965-9978(98)00065-9.

Communication pursuant to Article 94(3) EPC, 17 166 886.6-1224, dated Oct. 26, 2018.

* cited by examiner

☐ - SHELL ELEMENT 702
— - BAR ELEMENT 704

MODELING AND ANALYSIS OF LEADING EDGE RIBS OF AN AIRCRAFT WING

TECHNOLOGICAL FIELD

The present disclosure relates generally to modeling and analysis of a structure and, in particular, modeling and analysis of a leading edge rib of a fixed leading edge section of an aircraft wing.

BACKGROUND

Numerical modeling and analysis technology is an important tool in the design and verification of many engineered structures and the structural components of which they are composed. One common computer-based numerical modeling and analysis technique is finite element modeling and analysis. In accordance with various numerical modeling analysis techniques, numerical models may define a working environment in terms of geometry, elements, properties, loads, constraints and the like, and can thus be solved and analyzed to determine structural integrity of an engineered structure within that working environment, for example. Through numerical modeling and analysis and in particular finite element analysis, it may be possible to break a complex system down into a manageable (finite) number of elements (e.g., a curve drawn as a series of steps). These numerical models and their analysis may be used for several purposes, such as to help determine the behavior of a new airplane product design under various load environments.

A finite element model (e.g., finite element mesh) of a structural product can be generated directly from a Computer Aided Design (CAD) model of the product. Additionally or alternatively, inertial properties and/or geometric details of a structural product such as area, moment of inertia, centroid and the like can be identified for analysis by importing portions of a corresponding solid model into the finite element model. However, for a number of products (of similar nature), extracting information from the solid model and further building and analyzing the finite element model therefrom can be unduly complex and require excessive computing resources. In some instances, manual techniques such as identifying geometry for extraction are also necessary, but manual techniques often require an excessive amount of time.

Therefore, it may be desirable to have a system and method that take into account at least some of the issues discussed above, as well as possibly other issues.

BRIEF SUMMARY

Example implementations of the present disclosure are directed to an improved system, method and computer-readable storage medium for analysis of a leading edge rib of a fixed leading edge section of an aircraft wing. In particular, the system may automate recognition of geometric or inertial properties of the leading edge rib for use in determining its structural integrity. Using a solid model of the leading edge rib, the system may recognize geometric or inertial properties, for a large amount of components therein, in a time efficient manner. This may directly result in the system being able to reduce the overall time required for subsequent analysis and design flow by as much as eighty percent. The system may also reduce the occurrence of errors associated with similar manual processes.

In some example implementations, a method is provided for analysis of a leading edge rib of a fixed leading edge section of an aircraft wing. The method may comprise identifying one or more geometric or inertial properties of the plurality of stiffeners. The method may also include performing an analysis to predict a failure rate of the leading edge rib under an external load using the one or more geometric or inertial properties of the plurality of stiffeners, and from the failure rate, determining a structural integrity of the leading edge rib under the external load.

In particular, performing the analysis and determine the structural integrity may include importing a plurality of section cuts into a finite element model of the leading edge rib in which each section cut forms a cross-section corresponding to and having the one or more geometric or inertial properties of a respective stiffener of the plurality of stiffeners. Performing the analysis and determining the structural integrity may also include identifying respective nearest nodes and elements of the finite element model proximate the plurality of section cuts so imported.

Performing the analysis and determining the structural integrity may also include applying the external load to the finite element model, and thereunder extracting internal load distributions of elements of the finite element model proximate the respective nodes and elements. Performing the analysis and determining the structural integrity may also include predicting the failure rate of the leading edge rib under the external load based on the internal load distributions of the elements.

In some example implementations of the method of the preceding or any subsequent example implementation, or any combination thereof, identifying the respective nodes and elements of the finite element model proximate the plurality of section cuts so imported, includes therefrom respectively identifying an outermost node for each of the plurality of section cuts so imported, and the method further comprises defining Cartesian coordinate systems that originate at the outermost nodes and that have a common orientation; and extracting internal load distributions includes, for each axis of each of the Cartesian coordinate systems that originate at the outermost nodes, extracting the internal load distributions of the elements on a negative half of the axis proximate the outermost node.

In some example implementations of the method of any preceding or any subsequent example implementation, or any combination thereof, identifying outermost nodes of the finite element model includes the outermost nodes being an outermost common node of elements of the finite element model that represent the flange and web, the outermost common node representing a point of intersection therebetween.

In some example implementations of the method of any preceding or any subsequent example implementation, or any combination thereof, extracting the internal load distributions of the elements on the negative half of the axis includes being caused to extract six (6) load components, and predicting the failure rate includes being caused to predict the failure rate under the external load based on the six load components.

In some example implementations of the method of any preceding or any subsequent example implementation, or any combination thereof, wherein the one or more geometric or inertial properties of the cross-section include at least a cross-section type, dimensional measurements, centroid or moment of inertia of the cross-section.

In some example implementations of the method of any preceding or any subsequent example implementation, or any combination thereof, identifying the one or more geometric or inertial properties includes outputting the one or more geometric or inertial properties including the dimensional measurements, centroid or moment of inertia of the cross-section into a spreadsheet file, and exporting the cross-section type into an Initial Graphics Exchange Specification (IGES) file, and importing the plurality of section cuts includes being caused to import the plurality of section cuts using the spreadsheet file and IGES file.

In some example implementations of the method of any preceding or any subsequent example implementation, or any combination thereof, identifying the one or more geometric or inertial properties of the plurality of stiffeners includes producing a model including a one-dimensional (1D) curve model, two-dimensional (2D) surface model or a combination thereof from a 3D model of the fixed leading edge section of the aircraft wing, and therefrom, identifying the one or more geometric or inertial properties of the plurality of stiffeners based at least in part on the model including the 1D curve model, 2D surface model or the combination thereof.

In some example implementations of the method of any preceding or any subsequent example implementation, or any combination thereof, importing the plurality of section cuts into the finite element model of the leading edge rib includes importing the plurality of section cuts into the finite element model as exported from the 1D curve model, 2D surface model or the combination thereof. The one or more geometric or inertial properties thereby being based on the model including the 1D curve model, 2D surface model or the combination thereof.

In some example implementations of the method of any preceding or any subsequent example implementation, or any combination thereof, the respective stiffener includes at least a flange and web, and the elements of the finite element model include bar and shell elements respectively representing flanges and webs of the plurality of stiffeners.

In some example implementations, an apparatus is provided for analysis of a leading edge rib of a fixed leading edge section of an aircraft wing. The apparatus comprises a processor and a memory storing executable instructions that, in response to execution by the processor, cause the apparatus to implement a number of subsystems, such as a solid modeler and FEM system that may be configured to at least perform the method of any preceding example implementation, or any combination thereof.

In some example implementations, a computer-readable storage medium is provided for analysis of a leading edge rib of a fixed leading edge section of an aircraft wing. The computer-readable storage medium is non-transitory and has computer-readable program code portions stored therein that, in response to execution by a processor, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
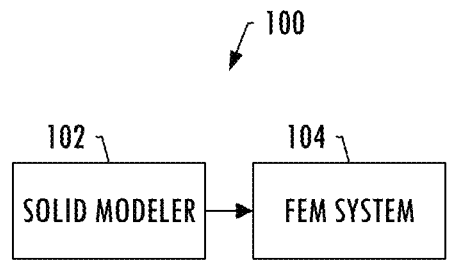
FIG. 1 is an illustration of a structural analysis system, according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference to something as being a first, second or the like should not be construed to imply a particular order. Also, for example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

Example implementations of the present disclosure are generally directed to at least modeling and analysis of a physical structure. Example implementations will be primarily described in conjunction with aerospace applications in which the structure is an aircraft including an aircraft wing, and an analysis is performed for a leading edge rib of a fixed leading edge section of the aircraft wing. It should be understood, however, that example implementations may be utilized in conjunction with a variety of other applications, both in the aerospace industry and outside of the aerospace industry.

Further, while example implementations will be primarily described in the context of a solid model and a finite element model of the structure, and performance of a finite element analysis from the finite element model. It should be understood, however, that example implementations may be configured to develop any of a number of different models one or more of which may not be considered a solid model or finite element model. It should also be understood that example implementations may be configured to perform any of a number of different analyses from the model one or more of which may not be considered finite element analysis. Examples of other suitable analyses include finite difference analysis, finite volume analysis, one or more probabilistic methods, and the like. Examples of other suitable models include a computational fluid dynamic model, thermal model, or any other type of model not explicitly set forth herein.

FIG. 1 illustrates a structural analysis system 100 according to example implementations of the present disclosure. As explained in greater detail below, in some examples, the structural analysis system may be configured to develop one or more appropriate models of a structure, perform an analysis of the structure from at least one model, and determine structural integrity based on data produced from the analysis. In the example implementations more specifically described herein, the structural analysis system may be configured to receive or generate a solid model, and based on at least a portion of the solid model, further develop a finite element model for analysis of the structure.

The structural analysis system 100 may be configured to perform a number of different functions or operations, either automatically, under direct operator control, or some combination of thereof. In this regard, the structural analysis system may be configured to perform one or more of its functions or operations automatically, that is, without being directly controlled by an operator. Additionally or alternatively, the structural analysis system may be configured to perform one or more of its functions or operations under direct operator control.

The structural analysis system 100 may include one or more of each of a number of different subsystems (each an individual system) coupled to one another for performing one or more functions or operations. As shown in FIG. 1, for example, the structural analysis system may include a solid modeler 102 and a finite element method (FEM) system 104 that may be coupled to one another. Although shown as part of the structural analysis system, the solid modeler or FEM system may instead be separate from but in communication with the structural analysis system. It should also be understood that either of the subsystems may function or operate as a separate system without regard to others of the subsystems. And further, it should be understood that the structural analysis system may include one or more additional or alternative subsystems than those shown in FIG. 1.

In accordance with example implementations of the present disclosure, the structural analysis system 100 may model and analyze a structure that may be or include an aircraft including an aircraft wing in which the aircraft wing may include a fixed leading edge section having a plurality of leading edge ribs therein. The solid modeler 102 may develop one or more appropriate solid models of the aircraft including the aircraft wing such as a three-dimensional (3D) model. For example, the solid modeler may be configured to receive or generate a 3D model of the aircraft including the aircraft wing and/or various components thereof.

The 3D model may represent the aircraft and its components (e.g., aircraft wing) by a collection of geometry. For example, the 3D model may represent the aircraft and its components as a collection of computer-graphics primitives such as edges, faces, points (e.g., vertices) and the like, which may be arranged into polygons or other arithmetically-derived structures to reflect the 3D geometry of the respective product and its components, including their surfaces, volumes or parts. The aircraft may be defined by a "boundary" representation, or collection of polygons that demarcate the space occupied by the product, which may include sub-collections of polygons that demarcate spaces occupied by respective components of the product. For some products, the 3D model may use hundreds of thousands of polygons.

Thus, for its operations, the solid modeler 102 may benefit from commercially-available software tools. Examples of suitable software tools include computer-aided design (CAD) systems, such as CATIA, SolidWorks or the like, available from Dassault Systèmes S.A. of Vélizy-Villacoublay, France. Other examples of suitable software tools include ABAQUS CAE available from Simulia (a subsidiary of Dassault Systèmes); Altair Hypermesh, available from Altair Engineering, Inc. of Troy, Mich.; PATRAN, available from MSC Software Corporation of Newport Beach, Calif.; the ANSYS software suite, available from ANSYS, Inc. of Canonsburg, Pa.; HyperSizer®, available from Collier Research Corporation of Newport News, Va.; GENESIS, available from Vanderplaats R&D, Inc. of Colo. Springs, Colo.; and the like.

The FEM system 104 may develop and analyze one or more appropriate finite element models of the aircraft including the aircraft wing. For example, the FEM system may be configured to receive or generate a finite element model of the aircraft including the aircraft wing and/or various components thereof. The finite element model may represent the aircraft by a mesh of finite elements, and it will be readily understood by a person of ordinary skill in the art that the aircraft may be represented by any zero, one, two or three dimensional element, such as a bar element for example. The elements may be or include one or more disjointed (non-overlapping) components of a mathematical model in which each element may possess a set of distinguishing points called nodal points or nodes.

Each element may be embodied in terms of a finite number of degrees of freedom characterized as a value of an unknown function, or function, at a set of nodal points. An element may further comprise degrees of freedom (DOF) that function as a point at which two elements may be connected and specify the state of the element. The degrees of freedom may be defined as the values and/or derivatives of a state variable at connected nodal points in which a state variable may refer to a variable utilized to describe a mathematical state of a model. In some example implementations, the nodal points may be located at the corners and/or end points of the elements such that the geometry of an element may be defined by the placement of geometric sets of nodal points.

The nodal dataset for each set of nodal points may include values of a property or state of the aircraft at respective nodal points of the set of nodal points. Examples of suitable properties include geometric or inertial properties and constitutive properties such as residual thickness, principal curvature, elastic modulus, thermal coefficient of expansion and the like. The constitutive properties may specify the material behavior of the structure at respective nodal points. Examples of suitable states include state variables such as components of the derived stress and strain tensors, and temperature at the respective nodal points. This method may also be applicable to element-based datasets such as element forces, properties, and the like.

The FEM system 104 may also be configured to perform an analysis of the finite element model of the aircraft. The analysis of the aircraft may be or include analysis via one or more algorithms and/or measurement-based analysis. For example, the FEM system may be configured to derive and solve governing matrix equations from the finite element model. The FEM system may also be configured to check the validity of the solutions (e.g., displacements, stresses, specialized stresses, error indicators); and in some examples, the FEM system may to perform at least one other appropriate analysis on the finite element model and/or solutions.

The FEM system 104 may benefit from commercially-available software tools. Examples of suitable tools include Abaqus, available from Dassault Systèmes S.A.; the ANSYS software suite (Fluent); NASTRAN/PATRAN, available from MSC Software Corporation; SolidWorks (COSMOS-works), COMSOL Multiphysics® (FEMLAB), available from COMSOL Inc. of Burlington, Mass.; GENESIS; Altair HyperView, available from Altair Engineering, Inc.; NX (Unigraphics), available from Siemens PLM Software of Plano, Tex.; TAK 2000, available from K&K Associates of Westminster, Colo.; Pro/ENGINEER, available from PTC Inc. of Needham, Mass.; LS-DYNA®, available from Livermore Software Technology Corporation (LSTC) of Livermore, Calif.; and the like.

Figure 2:
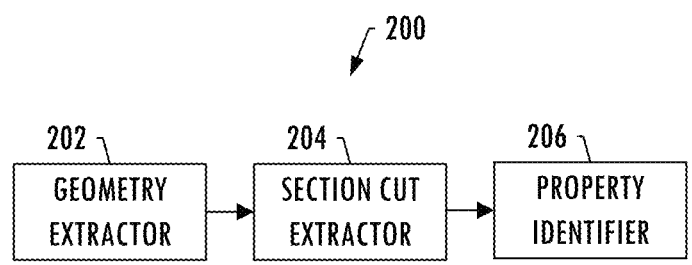
FIG. 2 is an illustration of a suitable solid modeler, according to examples implementations of the present disclosure.
Figure 3:
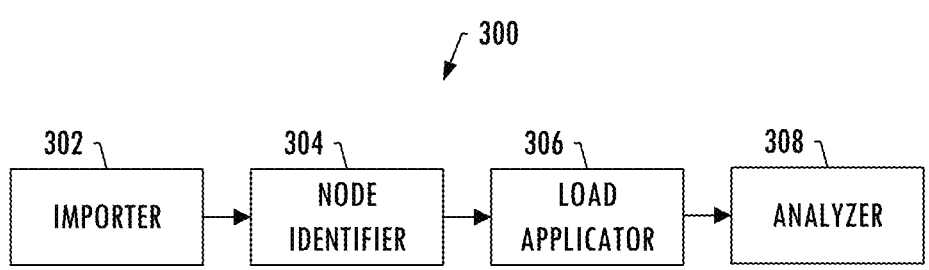
FIG. 3 is an illustration of a suitable FEM system, according to examples implementations of the present disclosure.

More particularly, according to example implementations of the present disclosure, the solid modeler 102 may be configured to identify one or more geometric or inertial properties of the plurality of stiffeners from a 3D model of a fixed leading edge section of the aircraft wing. The FEM system 104 may be configured to perform an analysis to predict a failure rate of the leading edge rib under an external load using the one or more geometric or inertial properties of the plurality of stiffeners. From the failure rate, the FEM system may also be configured to determine a structural integrity of the leading edge rib under the external load. Reference will now be made to FIGS. 2 and 3 which illustrate more particular examples of respectively a suitable solid modeler and FEM system, according to example implementations of the present disclosure.

FIG. 2 illustrates a suitable solid modeler 200 that according to one example implementation may correspond to the solid modeler 102 of FIG. 1. As shown, the solid modeler may include one or more of each of a number of different subsystems (each an individual system) coupled to one another for performing one or more functions or operations. In particular, the solid modeler may include a geometry extractor 202, section-cut extractor 204 and property identifier 206 coupled to one another to identify one or more geometric or inertial properties of the plurality of stiffeners.

In particular, the geometry extractor 202 may be configured to extract a collection of geometry for the leading edge rib from a 3D model of the fixed leading edge section of the aircraft wing, and the collection of geometry may represent at least the plurality of stiffeners of the leading edge rib. The section-cut extractor 204 may be configured to extract a section cut for each geometry of the collection of geometry that represents a respective stiffener of the plurality of stiffeners. The section cut may be extracted at a plane normal to a midline of the geometry that may otherwise be referred to herein as a "normal plane." The section cut may form a cross-section that corresponds to a respective stiffener of the plurality of stiffeners, and thereby the cross-section may have geometric or inertial properties that correspond to the respective stiffener.

In some examples, the section-cut extractor 204 may be configured to define and/or create a plurality of midlines of the geometry, and further define and/or create a plurality of normal planes respective to the midlines of each stiffener of the leading edge rib. For instance, the section-cut extractor may identify an outer mold line (OML) surface and inner stiffener lines of the leading edge rib. This may include identifying stiffener parallel lines and/or curves from which the midlines may be created, and as previously indicated the normal planes may be defined with respect to the midlines. In these examples, a plurality of normal planes may be defined to extract multiple section cuts based on analysis needs, for the same stiffener.

The property identifier 206 may be configured to then identify the geometric or inertial properties of the cross-section and thereby the respective stiffener based on a correlation of the cross-section (as identified by the section cut) to a generic profile formed by a union of a plurality of different cross-sections. The normal planes for plurality of stiffeners can be movably positioned across critical locations of the cross-section, to determine minimum and/or maximum values of the geometric or inertial properties. In some examples, the system may provide for determining conservative failure modes during the analysis based at least in part on the minimum values of the geometric properties.

In some implementations, the geometric or inertial properties may include a cross-section type (e.g., a plus sign (+), T, I, L, J, C or U-shaped cross-section) and/or an orientation of the cross-section (e.g., a left webbed or right webbed orientation). In some examples, the property identifier 206 may correlate the section cut to the generic profile to identify a number of intersections using offset planes defined therebetween, and the cross-section type may be identified based at least in part on the intersection, and the position of the intersection with respect to the normal plane or midline.

In particular, in some examples, a stiffener may include one or more flanges and a web, and property identifier 206 may define offset planes on either side of the midlines in which the offset planes may represent slightly more than the thickness of the web of the stiffener. For example, the offset planes may be defined at an equal distance on either side of the midline such that the distance there between equals the thickness of the web while accounting for some variation (e.g., web thickness+0.10). the property identifier may then identify the location and/or position of the. flange(s) based on a correlation of the cross-section to the generic profile at the offset planes. Accordingly, the cross-section type, dimensional measurements, centroid or moment of inertia may be determined with respect to the characteristics of the generic profile.

The section-cut 204 may be configured to execute various functions or operations for defining and/or creating the plurality of midlines. In particular, the section-cut extractor may generate a curve profile by intersecting a midplane of the leading edge section with the 3D model of the fixed leading edge section of the aircraft wing. The curve profile may then be disassembled to identify each individual curve. A spline connecting midpoints between the individually identified curves may thereby be defined as a midline.

In some examples, the geometric or inertial properties of the cross-section may specifically include dimensional measurements of the flange and web at the cross-section. For example, the geometric or inertial properties may include an edge fillet and/or an angle between the flange and web at the cross-section.

It should be noted that although, the example implementations are primarily discussed with reference to a 3D model of the fixed leading edge section of the aircraft wing, in some examples, the solid modeler may be configured to produce a model that includes a one-dimensional (1D) curve model, two-dimensional (2D) surface model or a combination thereof from the 3D model. In these examples, the geometry extractor 202 may extract the collection of geometry for the leading edge rib from the model including the 1D curve model, 2D surface model or the combination thereof, and the property identifier 206 may identify the one or more geometric or inertial properties of the plurality of stiffeners, and more particularly the cross-section and thereby the respective stiffener, based at least in part on the model including the 1D curve model, 2D surface model or the combination thereof.

For example, the geometry extractor 202 may determine the model type (e.g., 1D curve model, 2D surface model, or a combination thereof) and thereby extract the curves and/or surfaces that correspond to the plurality of stiffeners, and from which a section cut may be extracted by the section-cut extractor 204. The property identifier 206 may therefrom determine properties that are identifiable from the model type. For instance properties such as an area, moment of inertia or centroid may be identifiable from the 1D model, and properties such as gauge or thicknesses (e.g., a thickness of a web) may be identifiable from the 2D model.

In some examples, the property identifier 206 (or another subsystem of the solid modeler 200) may be further configured to output the geometric or inertial properties including the dimensional measurements, centroid or moment of inertia of the cross-section into a spreadsheet file (e.g., an Excel file), and export the cross-section type, and various details thereof, into an Initial Graphics Exchange Specification (IGES) file.

FIG. 3 illustrates a suitable FEM system 300 that according to one example implementation may correspond to the FEM system 104 of FIG. 1. As shown, the FEM system may include one or more of each of a number of different subsystems (each an individual system) coupled to one another for performing one or more functions or operations. In particular, the FEM system may include an importer 302, node identifier 304, load applicator 306 and analyzer 308 coupled to one another to perform one or more operations. In some examples, these operations may include an analysis of a finite element model of the leading edge rib to predict a failure rate of the leading edge rib under an external load using the one or more geometric or inertial properties of the plurality of stiffeners, and from the failure rate, determine a structural integrity of the leading edge rib under the external load.

In particular, the importer 302 may be configured to import a plurality of section cuts into a finite element model of the leading edge rib in which each section cut may form a cross-section that corresponds to and has the one or more geometric or inertial properties of a respective stiffener of the plurality of stiffeners. In some examples, the section cuts may be imported using the IGES files, as provided by the solid modeler 200, and similarly the geometric or inertial properties such as the dimensional measurements, centroid or moment of inertial may be imported using the spreadsheet file. The finite element model may thereby include the geometric or inertial properties of the plurality of stiffeners for use in performing an analysis of the leading edge rib.

As previously indicated, in some examples, the geometric or inertial properties may be identified and thereby outputted and/or exported from a 1D curve model, 2D surface model, or a combination thereof. In these examples, the importer 302 may be configured to import the plurality of section cuts into the finite element model as exported from the 1D and/or 2D model. Accordingly, the imported geometric or inertial properties may thereby be based on the model including the 1D curve model, 2D surface model or the combination thereof. For example, in an instance in which the model includes a 2D surface model, the importer may determine the model type includes the 2D surface model and thereby update the finite element model to include gauges of the webs as identified by the geometric or inertial properties.

The node identifier 304 may be configured to identify respective nodes and elements of the finite element model proximate the plurality of section cuts that were imported therein. Therefrom, the node identifier may further identify an outermost node of the respective nodes and elements. The outermost node may be an outermost common node of elements of the finite element model that represent the flange and web of the stiffener such that the outermost common node represents a point of intersection therebetween. The load applicator 306 may then be configured to apply an external load to the finite element model, and thereunder the analyzer 308 may be configured to extract internal load distributions of elements proximate the respective nodes. The analyzer may further predict the failure rate of the leading edge rib under the external load based on the internal load distributions of the elements.

It should be noted that, in some examples, the FEM system 300 is not required to solve the finite element model to extract the internal loads, rather the finite element model may be already solved such that the internal loads available for extraction. In particular the node identifier 304 may use the imported section cuts and define a local axis system with respect thereto. The analyzer 308 may then extract internal loads at the nearest outer node to each section cut, and further sum the extracted internal loads for all the nodes and elements that represents a section cut at that axis system.

In some examples, more particularly, the analyzer 308 may define Cartesian coordinate systems that originate at the outermost nodes and have a common orientation. In these examples, for each axis of each of the Cartesian coordinate systems that originate at the outermost nodes, the analyzer may only extract the internal load distributions of the proximate nodes and elements on the negative half of the axis with respect to the Cartesian coordinate system and proximate the outermost node. In some implementations, six (6) components of the internal load distributions (load components) may be extracted. The load components may include, for example, a force and moment of the elements for each axis of the Cartesian coordinate system. In particular, the force and moment may be extracted with respect to each axis resulting in three (3) force components and three moment components, and the predicted failure rate under the external load may be based on the six load components.

In some implementations, the FEM system 300 being configured to determine the structural integrity of the leading edge rib includes the analyzer 308 being configured to determine a margin of safety of the leading edge rib based on the internal load distributions and geometric or inertial properties of the plurality of stiffeners. In instances in which the margin of safety is negative, the analyzer may be configured to adjust geometric or inertial properties of the plurality of stiffeners that negatively affect the margin of safety. The analyzer may then perform an analysis of the leading edge rib under the external load and using the adjusted geometric or inertial properties.

This process may be iteratively repeated, and upon determining a positive margin of safety, the analyzer 308 may be further configured to output the adjusted geometric or inertial properties of the stiffeners in a comma-separated values (CSV) file. In some of these examples, the CSV file may be used by the solid modeler 200 for updating the solid model of the fixed leading edge section with the adjusted properties of the leading edge rib such that the stiffeners, and thereby the leading edge rib are resized within the solid model for optimal performance.

Figure 4A:
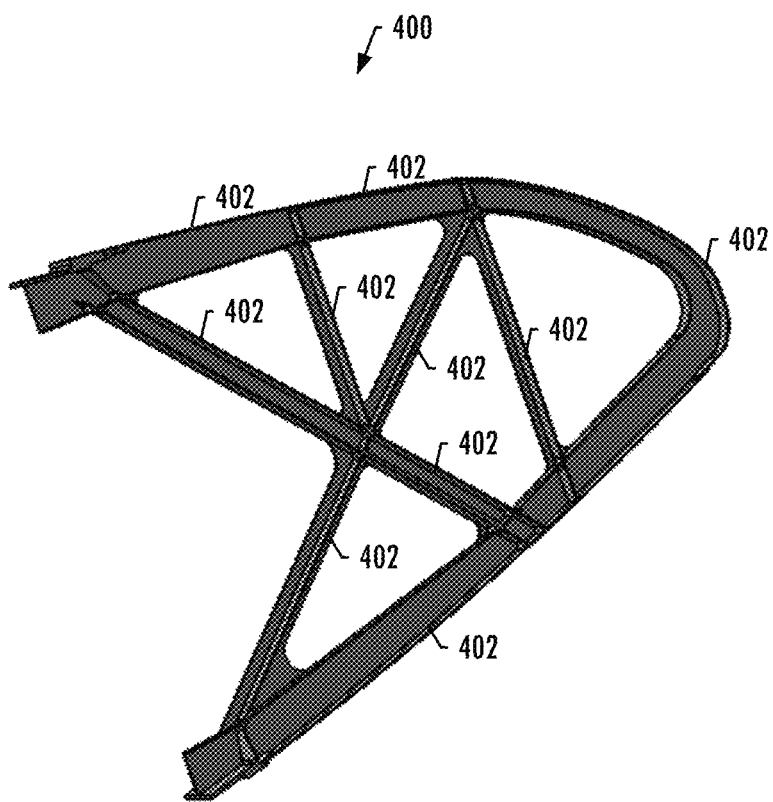
FIGS. 4A, 4B, 4C and 4D is an illustration of a leading edge rib of a fixed leading edge section of an aircraft wing, according to example implementations of the present disclosure.
Figure 4B:
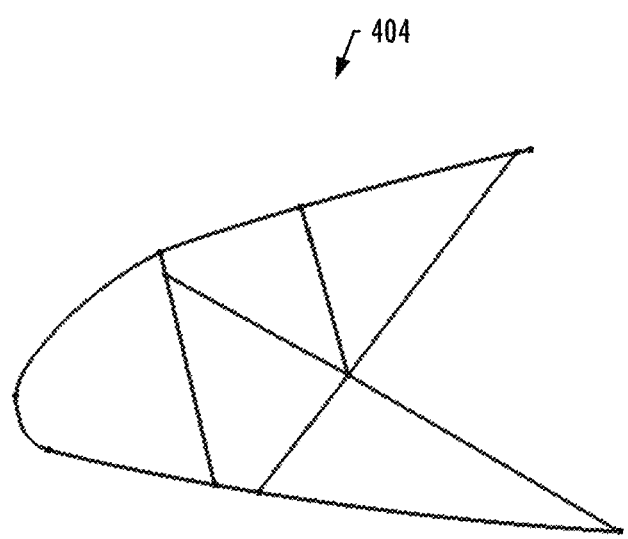
Figure 4C:
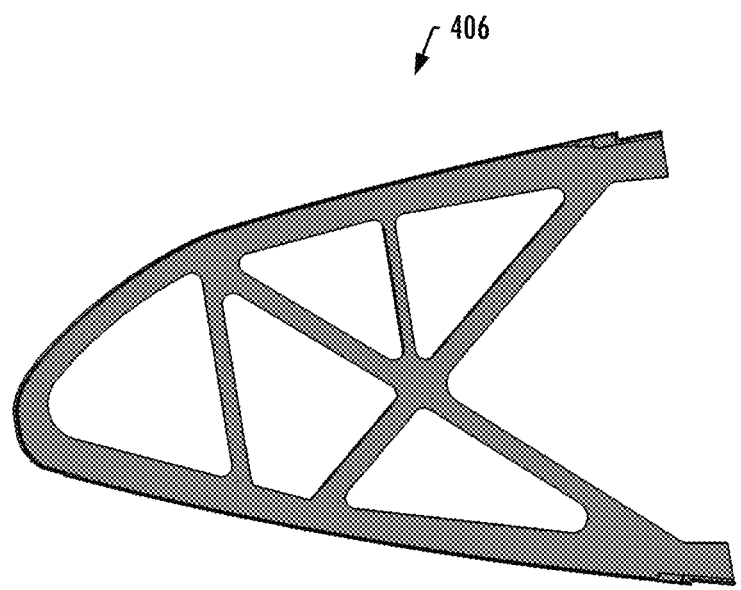
Figure 4D:
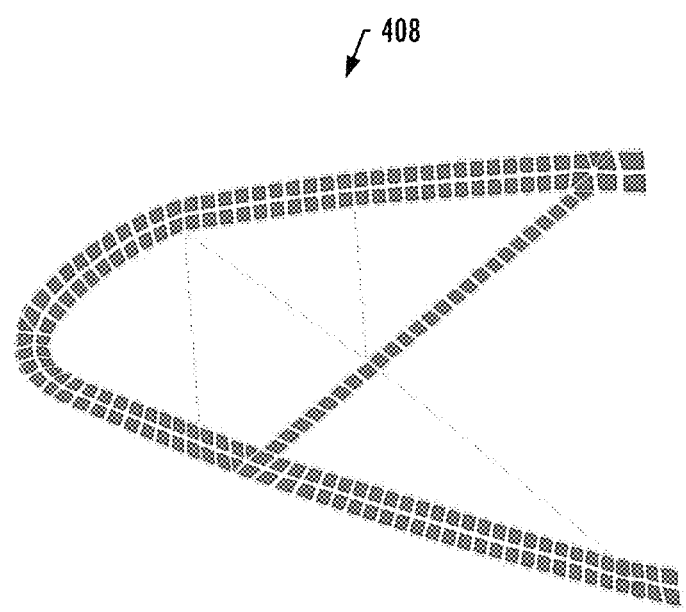

To further illustrate example implementations of the present disclosure, reference will now be made to FIGS. 4A-9. FIG. 4A illustrates a suitable solid model 400 of a leading edge rib of a fixed leading edge section of an aircraft wing. As shown, the leading edge rib may be composed of a plurality of stiffeners 402. FIGS. 4B, 4C and 4D respectively illustrate models 404, 406, 408 produced from the solid model of FIG. 4A and respectively including a one-dimensional (1D) curve model, two-dimensional (2D) surface model or a combination of a 1D curve model and 2D surface model.

Figure 5A:
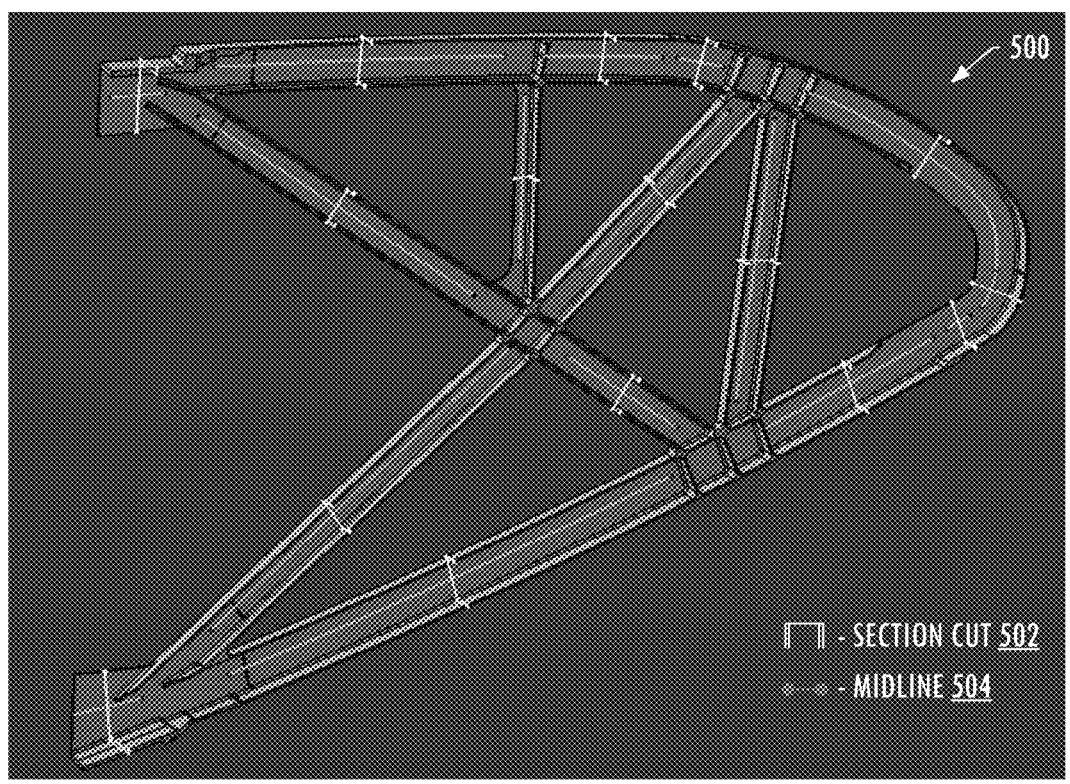
FIGS. 5A, 5B and 5C illustrate a three-dimensional model of a leading edge rib, according to example implementations of the present disclosure.
Figure 5B:
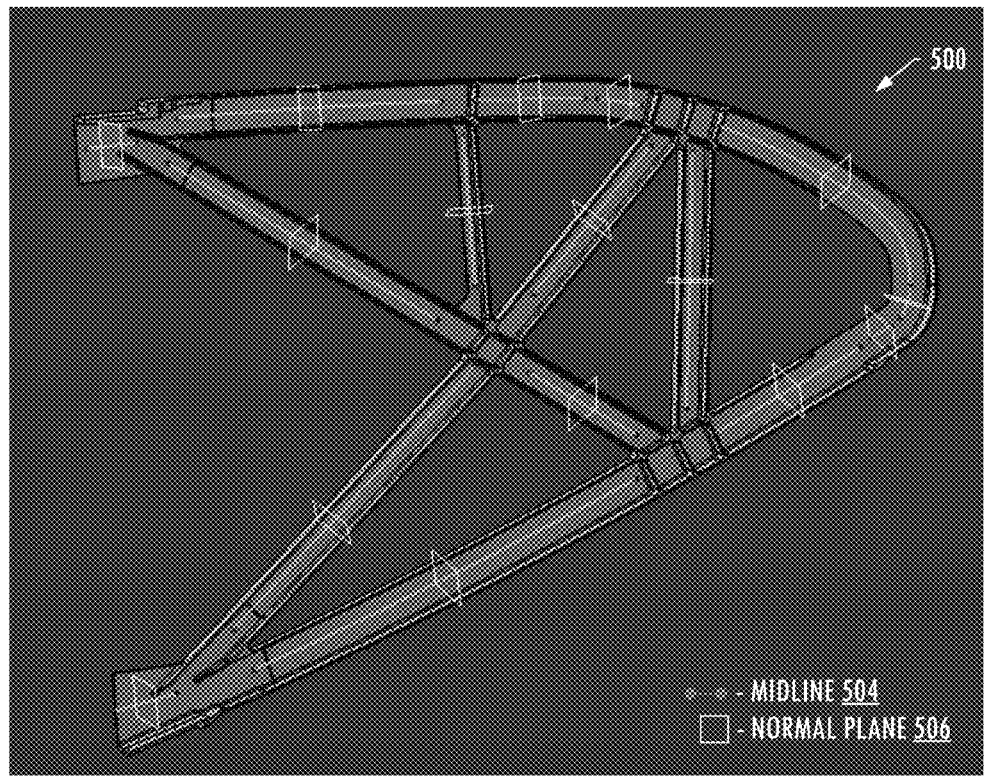
Figure 5C:
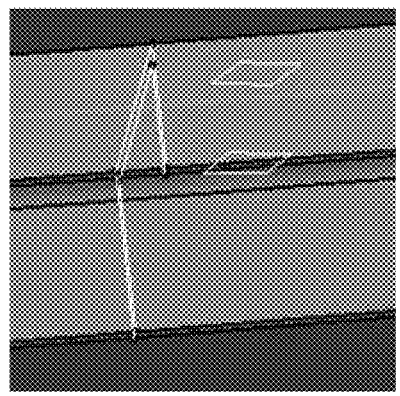

FIGS. 5A, 5B and 5C illustrate the solid model 400 of FIG. 4, and more particularly illustrate a collection of geometry that represents a leading edge rib as extracted from a solid model of the fixed leading edge section of the aircraft wing. As shown, the collection of geometry also thereby represents the plurality of stiffeners of the leading edge rib. FIG. 5A illustrates, a section cut 502 that may be extracted for each geometry of the collection of geometry that represents a respective stiffener of the plurality of stiffeners. As shown in FIG. 5A, the section cut may be extracted with respect to a midline 504 of the geometry. More particularly, the section cut may be extracted at a plane 504 normal to the midline 506 of the geometry, as shown in FIG. 5B.

In these examples, a plurality of midlines 504 and corresponding normal planes 506 may be defined and/or created for each stiffener of the leading edge rib. In some examples, offset planes 508 may also be defined on either side of the midline, as shown in FIG. 5C.

Figure 6:
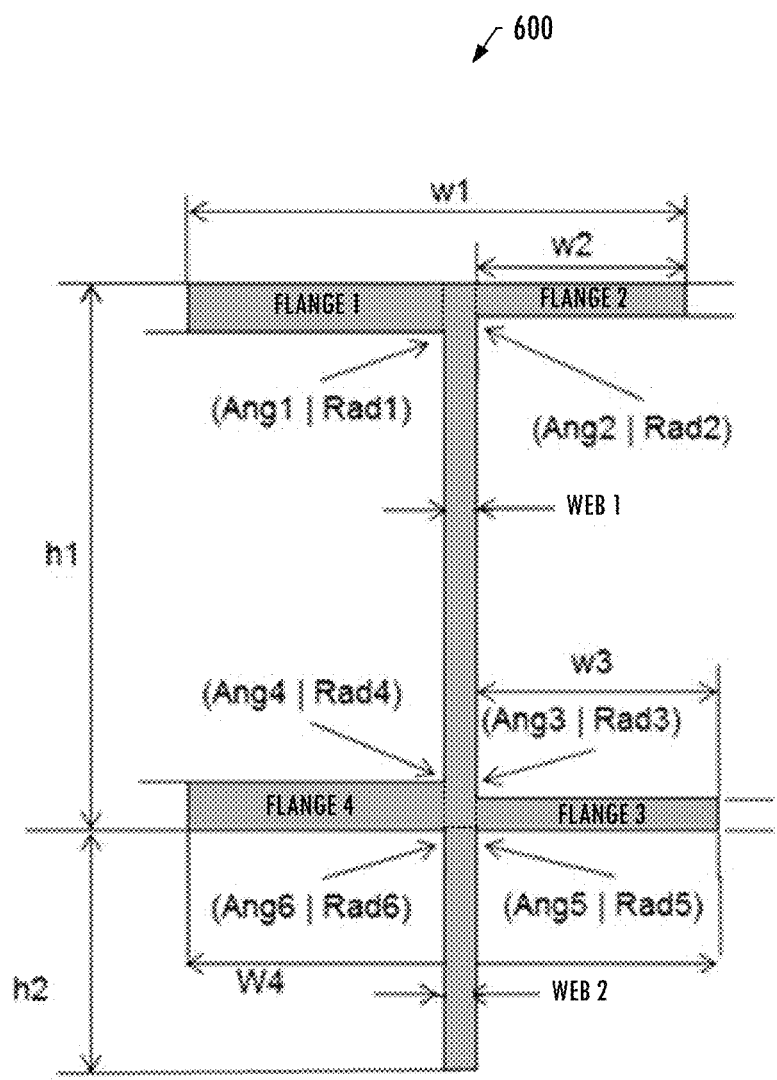
FIG. 6 is an illustration of a generic profile, according to example implementations of the present disclosure.
Figure 7:
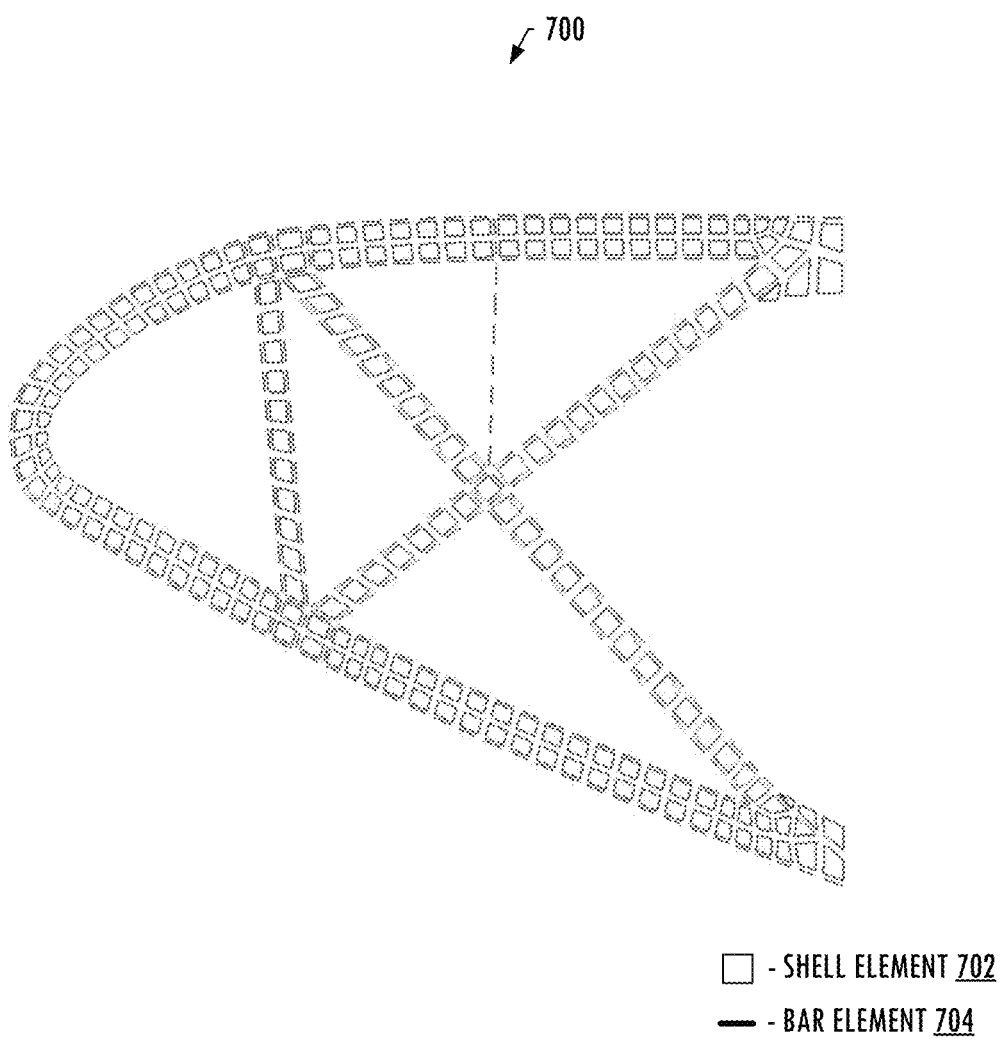
FIGS. 7, 8A, 8B and 9 illustrate a finite element model, according to example implementations of the present disclosure.

As previously indicated, geometric or inertial properties of a cross-section (as identified by the extracted section cut 502) and thereby the respective stiffener may be identified based on a correlation of the cross-section to a generic profile formed by a union of a plurality of different cross-sections. FIG. 6 illustrates a suitable generic profile 600 that may be formed by the union of a number of cross-section types and/or orientations. In some examples, the stiffener includes one or more flanges (e.g., Flanges 1, 2, 3 and 4) and a web (e.g., webs 1 and 2), and the geometric or inertial properties of the cross-section may include dimensional measurements (e.g., width w, height h, angle given radians ang|rad and the like) of the flange and web at the cross-section.

The geometric or inertial properties may be used in conjunction with a finite element model for performing an analysis to predict a failure rate of a leading edge rib under an external load. FIGS. 7, 8A, 8B and 9 illustrate a suitable finite element model 700 of the leading edge rib (one example of which may be the leading edge rib 400 of FIG. 4), from which the analysis may be performed. As previously indicated, in some examples, each stiffener may include one or more flanges and a web. In these examples, the finite element model may represent the leading edge rib by a mesh of elements including shell elements 702 and bar elements 704 that respectively correspond to the webs and flanges of the stiffeners. It should be noted that although FIGS. 8A and 9 primarily illustrate the finite element model including shell elements, it should be understood that the finite element model may include both shell and bar elements.

Figure 8A:
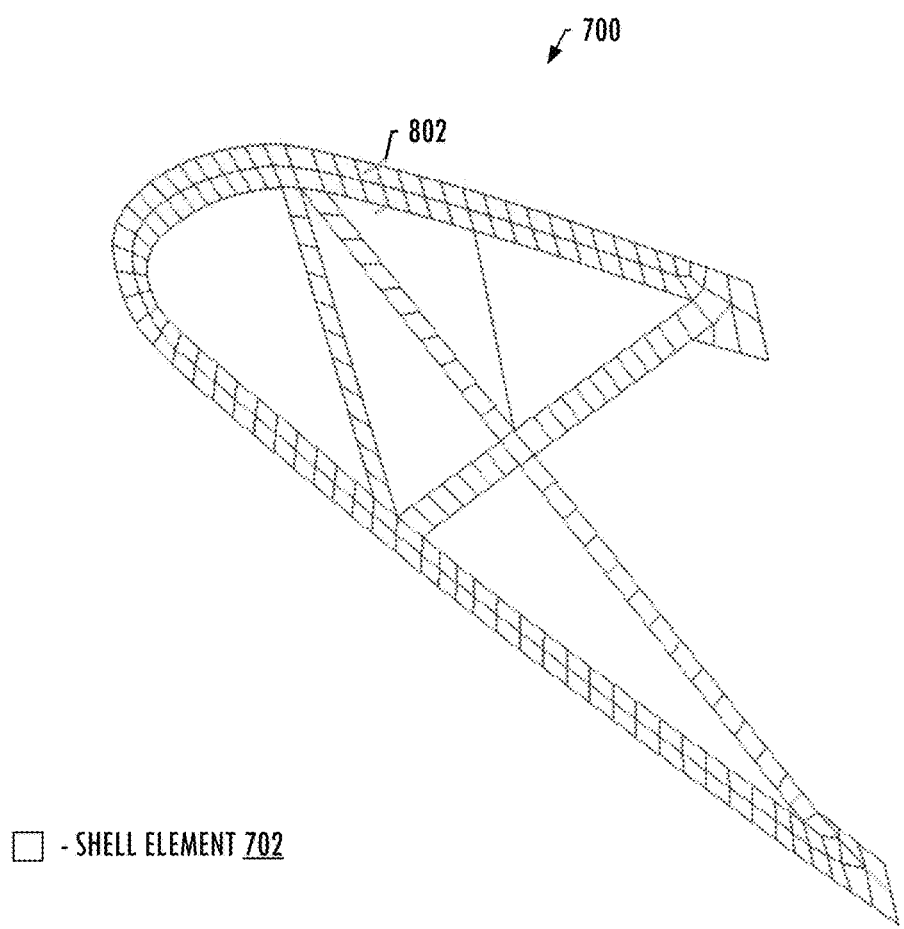

The finite element model 700 of the leading edge rib may include the identified geometric or inertial properties of the plurality of stiffeners therein. In particular, a plurality of section cuts 802 may be imported into the finite element, as shown in FIG. 8A. As more particularly shown in FIG. 8B, respective nodes 804 of the finite element model that are proximate the plurality of section cuts may then be identified, and therefrom an outermost node 804a to the section cut may be identified. In particular, the outermost node may be an outermost common node of elements 702, 704 of the finite element model that represent the flange and web such that the outermost common node represents a point of intersection therebetween.

Figure 8B:
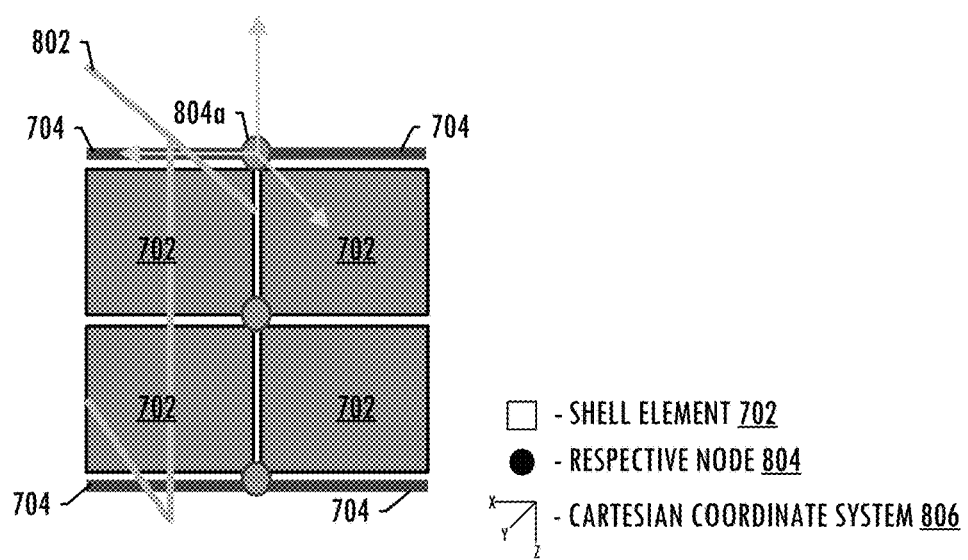
Figure 9:
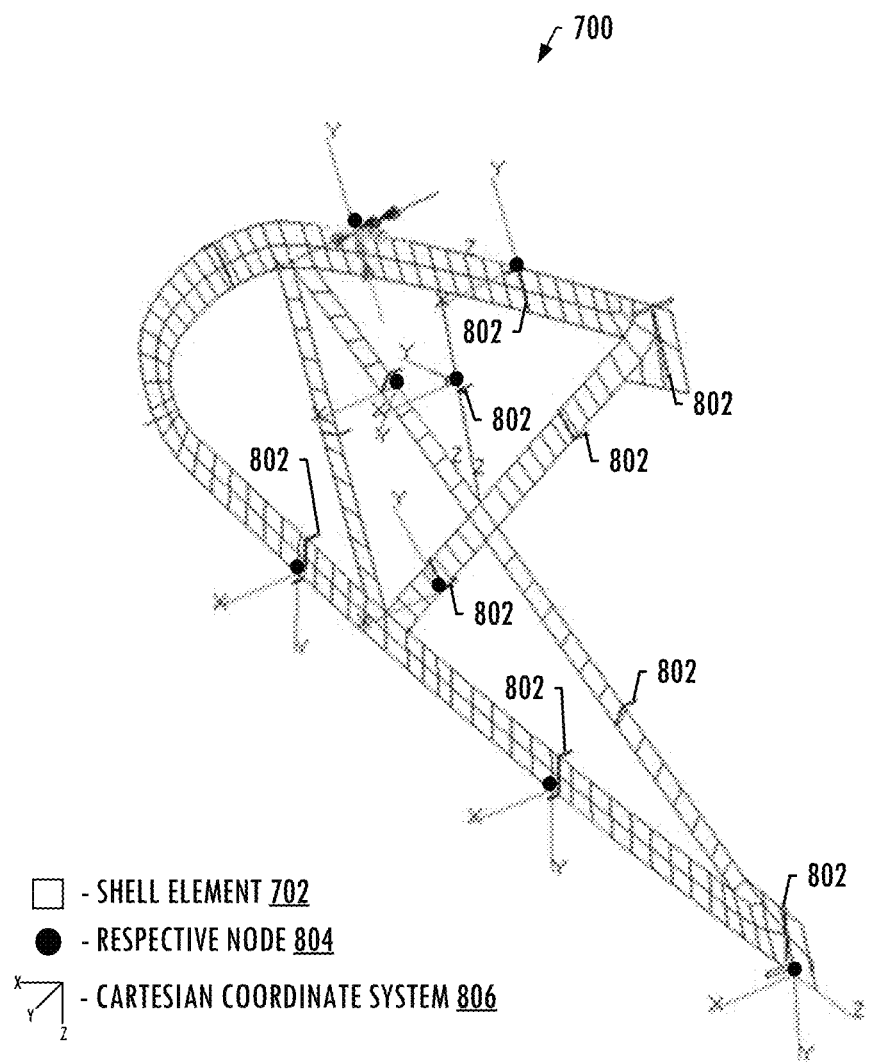

As shown in FIG. 8B and further shown in FIG. 9, in some examples, Cartesian coordinate systems 806 may be defined in which the Cartesian coordinate systems originate at the respective nodes and have a common orientation. In these examples, for each axis x, z, y of each of the Cartesian coordinate systems, the internal load distributions may be extracted for the elements 702, 704 on a negative half of the axis proximate the respective nodes and elements, and more particularly the outermost node 804a to the section cut 802 at which the axis or coordinate system is defined.

Figure 10:
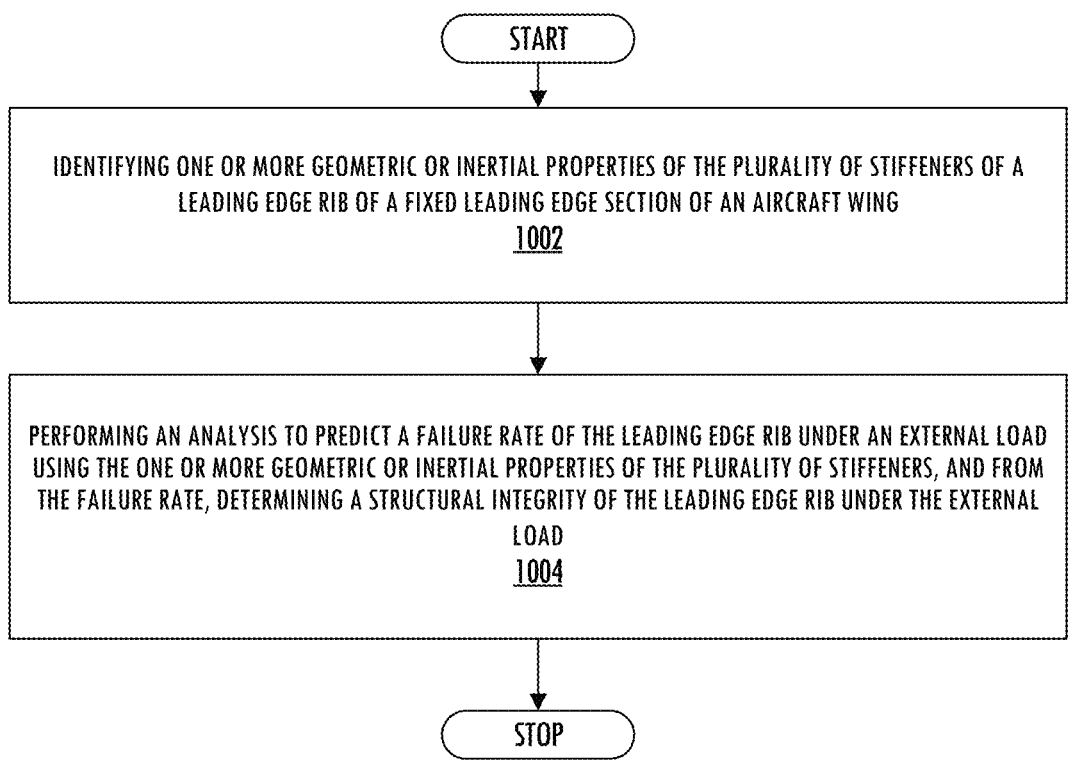
FIGS. 10, 11 and 12 are flow diagrams illustrating various operations of a method for analysis of a leading edge rib of a fixed leading edge section of an aircraft wing, in accordance with an example implementation.

FIG. 10 illustrates a flowchart including various operations of a method 1000 for analysis of a leading edge rib of a fixed leading edge section of an aircraft wing in accordance with an example implementation of the present disclosure. As shown at block 1002, the method may include identifying one or more geometric or inertial properties of the plurality of stiffeners. The method may also include performing an analysis to predict a failure rate of the leading edge rib under an external load using the one or more geometric or inertial properties of the plurality of stiffeners, and from the failure rate, determining a structural integrity of the leading edge rib under the external load, as shown at block 1004.

Figure 11:
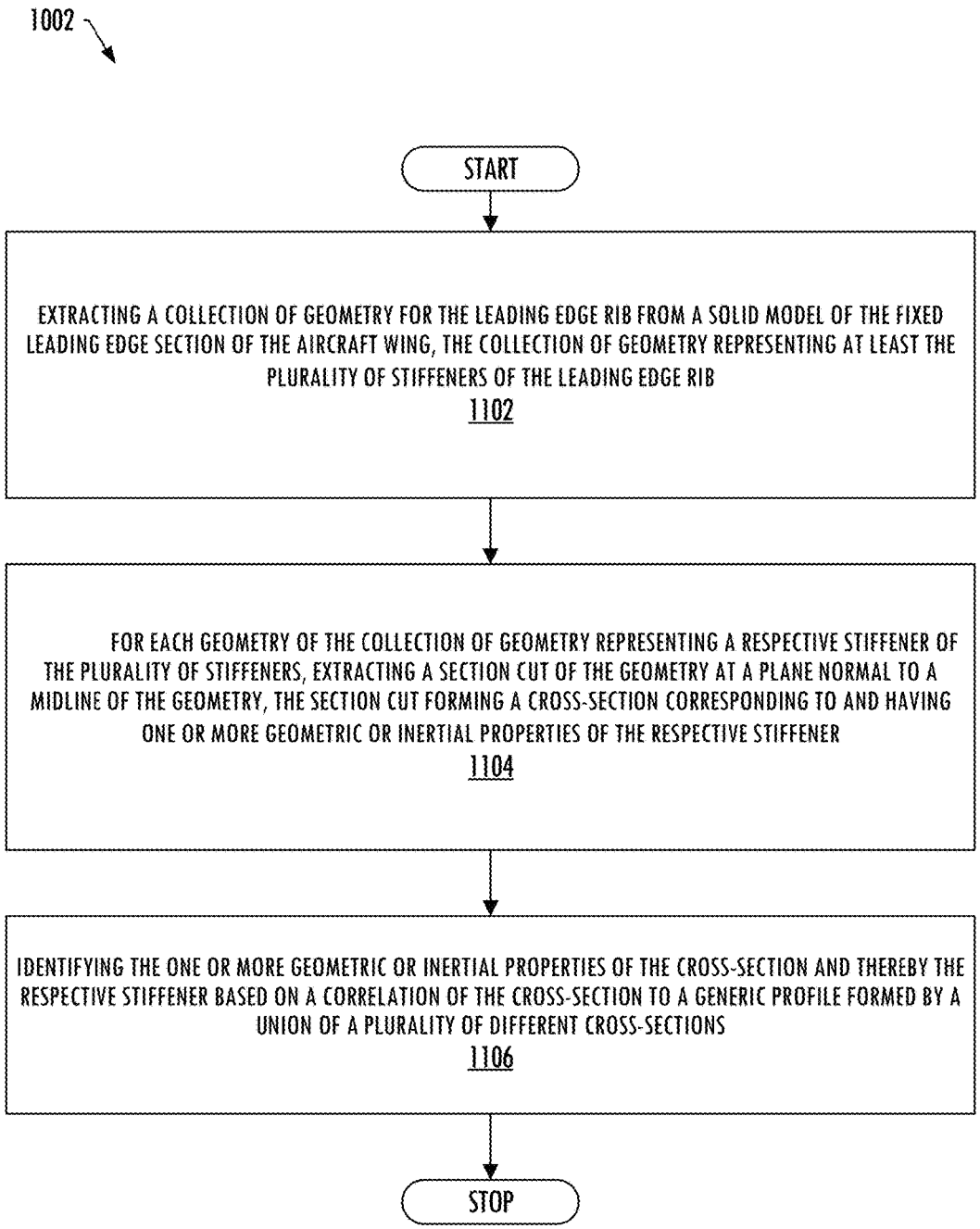

FIG. 11 illustrates a flowchart including various sub-operations of the method step 1002 of FIG. 10. The method step may include extracting a collection of geometry for the leading edge rib from a solid model of the fixed leading edge section of the aircraft wing in which the collection of geometry represents at least the plurality of stiffeners of the leading edge rib, as shown at block 1102. For each geometry of the collection of geometry representing a respective stiffener of the plurality of stiffeners, the method step may also include extracting a section cut of the geometry at a plane normal to a midline of the geometry, as shown at block 1104. The section cut may form a cross-section corresponding to and having one or more geometric or inertial properties of the respective stiffener. The method step may further include identifying the one or more geometric or inertial properties of the cross-section and thereby the respective stiffener based on a correlation of the cross-section to a generic profile formed by a union of a plurality of different cross-sections, as shown at block 1106.

Figure 12:
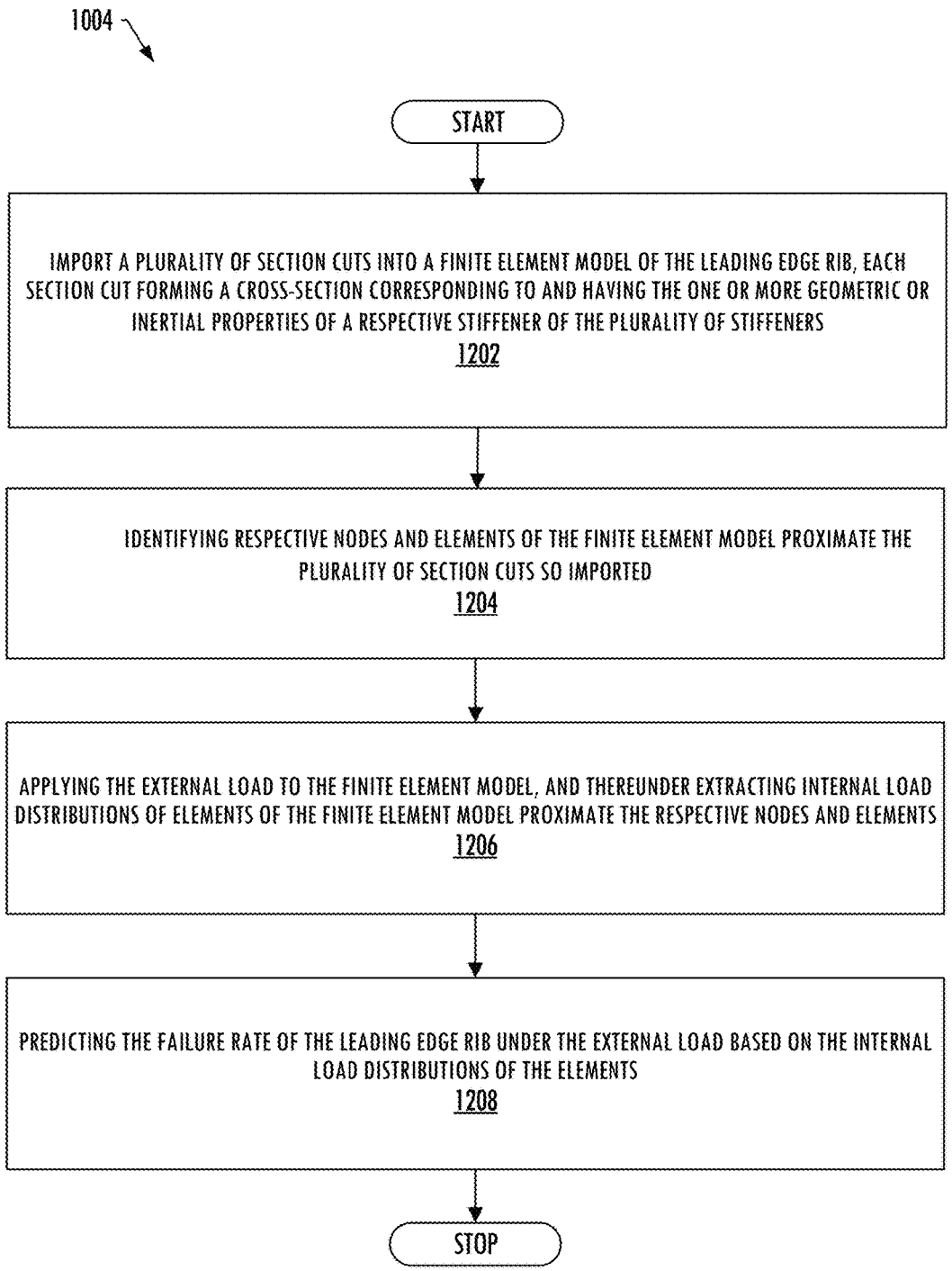

FIG. 12 illustrates a flowchart including various sub-operations of the method step 1004 of FIG. 10. The method may include importing a plurality of section cuts into a finite element model of the leading edge rib, as shown at block 1202. Each section cut may form a cross-section corresponding to and having the one or more geometric or inertial properties of a respective stiffener of the plurality of stiffeners. The method step may also include identifying respective nodes and elements of the finite element model proximate the plurality of section cuts so imported, as shown at block 1204. The section cut may form a cross-section corresponding to and having one or more geometric or inertial properties of the respective stiffener.

The method step 1004 may also include applying the external load to the finite element model, and thereunder extracting internal load distributions of elements of the finite element model proximate the respective nodes and elements, as shown at block 1206. The method step may further include predicting the failure rate of the leading edge rib under the external load based on the internal load distributions of the elements, as shown at block 1208.

According to example implementations of the present disclosure, the system 100 and its subsystems and/or components including the solid modeler 102 and/or FEM system 104 may be implemented by various means. Similarly, the solid modeler 200, FEM system 300 and their respective subsystems and/or components may be implemented by various means. Means for implementing the systems, subsystems and their respective elements may include hardware, alone or under direction of one or more computer programs from a computer-readable storage medium.

In some examples, one or more apparatuses may be provided that are configured to function as or otherwise implement the systems, subsystems, tools and respective elements shown and described herein. In examples involving more than one apparatus, the respective apparatuses may be connected to or otherwise in communication with one another in a number of different manners, such as directly or indirectly via a wired or wireless network or the like.

Figure 13:
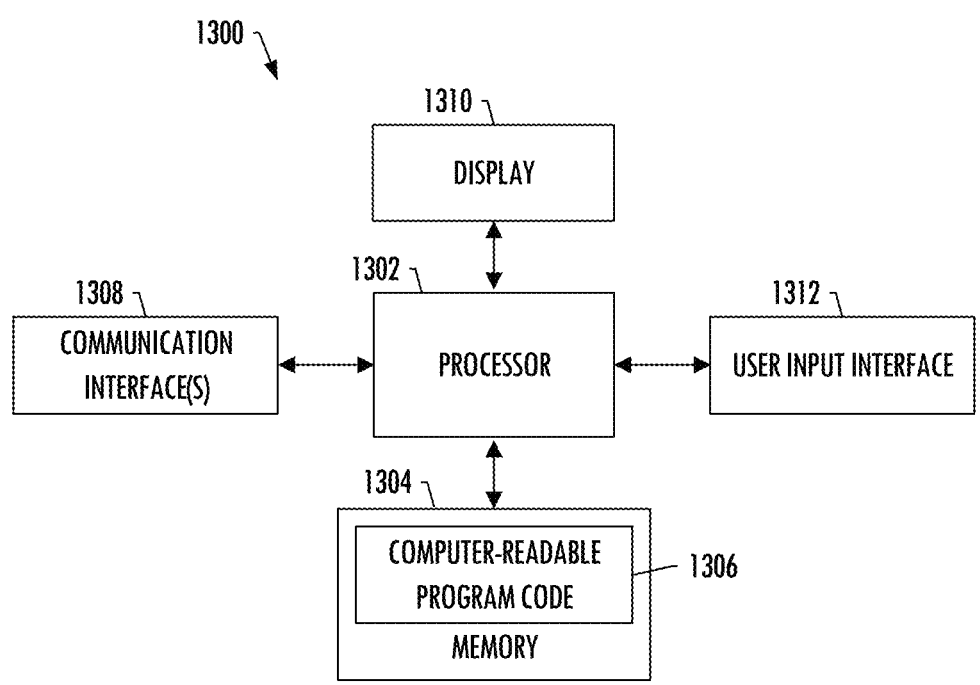
FIG. 13 illustrates an apparatus according to some example implementations.

FIG. 13 illustrates an apparatus 1300 according to some example implementations of the present disclosure. Generally, an apparatus of example implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor 1302 (e.g., processor unit) connected to a memory 1304 (e.g., storage device).

The processor 1302 is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 1304 (of the same or another apparatus).

The processor 1302 may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory 1304 is generally any piece of computer hardware that is capable of storing information such as, for example, data, computer programs (e.g., computer-readable program code 1306) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 1310 and/or one or more user input interfaces 1312 (e.g., input/output unit). The display may be configured to present or otherwise display information to a user, suitable examples of which include a liquid crystal display (LCD), light-emitting diode display (LED), plasma display panel (PDP) or the like.

The user input interfaces 1312 may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 1300 may include a processor 1302 and a computer-readable storage medium or memory 1304 coupled to the processor, where the processor is configured to execute computer-readable program code 1306 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for design of a leading edge rib of a fixed leading edge section of an aircraft wing, the leading edge rib including a plurality of stiffeners, the apparatus comprising a processor and a memory storing executable instructions that, in response to execution by the processor, cause the apparatus to at least:

generate a three-dimensional (3D) model of the fixed leading edge section of the aircraft wing;

identify one or more geometric or inertial properties of the plurality of stiffeners; and perform a computer-aided engineering, structural analysis to predict a failure rate of the leading edge rib under an external load using the one or more geometric or inertial properties of the plurality of stiffeners, and from the failure rate, determine a structural integrity of the leading edge rib under the external load, including the apparatus being caused to:

import a plurality of section cuts into a finite element model of the leading edge rib, each section cut forming a cross-section corresponding to and having the one or more geometric or inertial properties of a respective stiffener of the plurality of stiffeners;

identify respective nodes and elements of the finite element model proximate the plurality of section cuts so imported;

apply the external load to the finite element model, and thereunder extract internal load distributions of elements of the finite element model proximate the respective nodes and elements; and predict the failure rate of the leading edge rib under the external load based on the internal load distributions of the elements, the structural integrity including a margin of safety of the leading edge rib; and when the margin of safety is negative, iteratively adjust the one or more geometric or inertial properties of the plurality of stiffeners based on the margin of safety, and repeat the computer-aided engineering, structural analysis, until the margin of safety is positive; and update the 3D model with the one or more geometric or inertial properties of the plurality of stiffeners as adjusted such that the plurality of stiffeners and thereby the leading edge rib are resized within the 3D model.

2. The apparatus of claim 1, wherein the apparatus being caused to identify the respective nodes and elements of the finite element model proximate the plurality of section cuts so imported, includes being caused to therefrom respectively identify an outermost node for each of the plurality of section cuts so imported, and the memory stores further executable instructions that, in response to execution by the processor, cause the apparatus to further at least:

define Cartesian coordinate systems that originate at the outermost nodes and that have a common orientation, and wherein the apparatus being caused to extract internal load distributions includes, for each axis of each of the Cartesian coordinate systems that originate at the outermost nodes, the apparatus being caused to extract the internal load distributions of the elements on a negative half of the axis proximate the outermost node.

3. The apparatus of claim 2, wherein the apparatus being caused to identify the outermost node includes the outermost node being a common node of elements of the finite element model that represent the flange and web, the common node representing a point of intersection therebetween.

4. The apparatus of claim 2, wherein the apparatus being caused to extract the internal load distributions of the elements on the negative half of the axis includes being caused to extract six (6) load components, and the apparatus being caused to predict the failure rate includes being caused to predict the failure rate under the external load based on the six load components.

5. The apparatus of claim 1, wherein the one or more geometric or inertial properties of the cross-section include at least a cross-section type, dimensional measurements, centroid or moment of inertia of the cross-section.

6. The apparatus of claim 5, wherein the apparatus being caused to identify the one or more geometric or inertial properties includes being caused to:
output the one or more geometric or inertial properties including the dimensional measurements, centroid or moment of inertia of the cross-section into a spreadsheet file; and
export the cross-section type into an Initial Graphics Exchange Specification (IGES) file, and the apparatus being caused to import the plurality of section cuts includes being caused to import the plurality of section cuts using the spreadsheet file and IGES file.

7. The apparatus of claim 1, wherein the apparatus being caused to identify the one or more geometric or inertial properties of the plurality of stiffeners includes being caused to:
produce a model including a one-dimensional (1D) curve model, two-dimensional (2D) surface model or a combination thereof from a 3D model of the fixed leading edge section of the aircraft wing; and therefrom,
identify the one or more geometric or inertial properties of the plurality of stiffeners based at least in part on the model including the 1D curve model, 2D surface model or the combination thereof.

8. The apparatus of claim 7, wherein the apparatus being caused to import the plurality of section cuts into the finite element model of the leading edge rib includes being caused to:
import the plurality of section cuts into the finite element model as exported from the 1D curve model, 2D surface model or the combination thereof, the one or more geometric or inertial properties thereby being based on the model including the 1D curve model, 2D surface model or the combination thereof.

9. The apparatus of claim 1, wherein the respective stiffener includes at least a flange and web, and the elements of the finite element model include bar and shell elements respectively representing flanges and webs of the plurality of stiffeners.

10. A method for design of a leading edge rib of a fixed leading edge section of an aircraft wing, the leading edge rib including a plurality of stiffeners, the method comprising:
generating a three-dimensional (3D) model of the fixed leading edge section of the aircraft wing;
identifying one or more geometric or inertial properties of the plurality of stiffeners; and
performing a computer-aided engineering, structural analysis to predict a failure rate of the leading edge rib under an external load using the one or more geometric or inertial properties of the plurality of stiffeners, and from the failure rate, determining a structural integrity of the leading edge rib under the external load, including:
importing a plurality of section cuts into a finite element model of the leading edge rib, each section cut forming a cross-section corresponding to and having the one or more geometric or inertial properties of a respective stiffener of the plurality of stiffeners;
identifying respective nodes and elements of the finite element model proximate the plurality of section cuts so imported;
applying the external load to the finite element model, and thereunder extracting internal load distributions of elements of the finite element model proximate the respective nodes and elements; and
predicting the failure rate of the leading edge rib under the external load based on the internal load distributions of the elements,
the structural integrity including a margin of safety of the leading edge rib; and when the margin of safety is negative,
iteratively adjusting the one or more geometric or inertial properties of the plurality of stiffeners based on the margin of safety, and repeating the computer-aided engineering structural analysis, until the margin of safety is positive; and
updating the 3D model with the one or more geometric or inertial properties of the plurality of stiffeners as adjusted such that the plurality of stiffeners and thereby the leading edge rib are resized within the 3D model.

11. The method of claim 10 wherein identifying the respective nodes and elements of the finite element model proximate the plurality of section cuts so imported, includes therefrom respectively identifying an outermost node for each of the plurality of section cuts so imported, and the method further comprises:
defining Cartesian coordinate systems that originate at the outermost nodes and that have a common orientation, and
extracting internal load distributions includes, for each axis of each of the Cartesian coordinate systems that originate at the outermost nodes, extracting the internal load distributions of the elements on a negative half of the axis proximate the outermost node.

12. The apparatus of claim 11, wherein identifying outermost nodes of the finite element model includes the outermost nodes being an outermost common node of elements of the finite element model that represent the flange and web, the outermost common node representing a point of intersection therebetween.

13. The method of claim 11, wherein extracting the internal load distributions of the elements on the negative half of the axis includes being caused to extract six (6) load components, and predicting the failure rate includes being caused to predict the failure rate under the external load based on the six load components.

14. The method of claim 10, wherein the one or more geometric or inertial properties of the cross-section include at least a cross-section type, dimensional measurements, centroid or moment of inertia of the cross-section.

15. The method of claim 14, wherein identifying the one or more geometric or inertial properties includes:
outputting the one or more geometric or inertial properties including the dimensional measurements, centroid or moment of inertia of the cross-section into a spreadsheet file; and
exporting the cross-section type into an Initial Graphics Exchange Specification (IGES) file, and importing the plurality of section cuts includes being caused to import the plurality of section cuts using the spreadsheet file and IGES file.

16. The method of claim 10, wherein identifying the one or more geometric or inertial properties of the plurality of stiffeners includes:
   producing a model including a one-dimensional (1D) curve model, two-dimensional (2D) surface model or a combination thereof from a 3D model of the fixed leading edge section of the aircraft wing; and therefrom,
   identifying the one or more geometric or inertial properties of the plurality of stiffeners based at least in part on the model including the 1D curve model, 2D surface model or the combination thereof.

17. The method of claim 16, wherein importing the plurality of section cuts into the finite element model of the leading edge rib includes:
   importing the plurality of section cuts into the finite element model as exported from the 1D curve model, 2D surface model or the combination thereof, the one or more geometric or inertial properties thereby being based on the model including the 1D curve model, 2D surface model or the combination thereof.

18. The apparatus of claim 10, wherein the respective stiffener includes at least a flange and web, and the elements of the finite element model include bar and shell elements respectively representing flanges and webs of the plurality of stiffeners.

19. A computer-readable storage medium for design of a leading edge rib of a fixed leading edge section of an aircraft wing, the leading edge rib including a plurality of stiffeners, the computer-readable storage medium being non-transitory and having computer-readable program code portions stored therein that in response to execution by a processor, cause an apparatus to at least:
   identify one or more geometric or inertial properties of the plurality of stiffeners; and
   perform a computer-aided engineering, structural analysis to predict a failure rate of the leading edge rib under an external load using the one or more geometric or inertial properties of the plurality of stiffeners, and from the failure rate, determine a structural integrity of the leading edge rib under the external load, including the apparatus being caused to:
      import a plurality of section cuts into a finite element model of the leading edge rib, each section cut forming a cross-section corresponding to and having the one or more geometric or inertial properties of a respective stiffener of the plurality of stiffeners;
      identify respective proximate nodes and elements of the finite element model proximate the plurality of section cuts so imported;
      apply the external load to the finite element model, and thereunder extract internal load distributions of elements of the finite element model proximate the respective nodes and elements; and
      predict the failure rate of the leading edge rib under the external load based on the internal load distributions of the elements,
   the structural integrity including a margin of safety of the leading edge rib; and when the margin of safety is negative,
   iteratively adjust the one or more geometric or inertial properties of the plurality of stiffeners based on the margin of safety, and repeat the computer-aided engineering, structural analysis, until the margin of safety is positive; and
   update the 3D model with the one or more geometric or inertial properties of the plurality of stiffeners as adjusted such that the plurality of stiffeners and thereby the leading edge rib are resized within the 3D model.

20. The computer-readable storage medium of claim 19, wherein the memory stores further executable instructions that, in response to execution by the processor, cause the apparatus to further at least define Cartesian coordinate systems that originate at the respective node s and that have a common orientation, and
   wherein the apparatus being caused to extract internal load distributions includes, for each axis of each of the Cartesian coordinate systems that originates at a node of the respective nodes, the apparatus being caused to extract the internal load distributions of the elements on a negative half of the axis proximate the node.

21. The computer-readable storage medium of claim 20, wherein the apparatus being caused to identify the outermost node includes the outermost node being an outermost common node of elements of the finite element model that represent the flange and web, the outermost common node representing a point of intersection therebetween.

22. The computer-readable storage medium of claim 20, wherein the apparatus being caused to extract the internal load distributions of the elements on the negative half of the axis includes being caused to extract six (6) load components, and the apparatus being caused to predict the failure rate includes being caused to predict the failure rate under the external load based on the six load components.

23. The computer-readable storage medium of claim 19, wherein the one or more geometric or inertial properties of the cross-section include at least a cross-section type, dimensional measurements, centroid or moment of inertia of the cross-section.

24. The computer-readable storage medium of claim 23, wherein the apparatus being caused to identify the one or more geometric or inertial properties includes being caused to:
   output the one or more geometric or inertial properties including the dimensional measurements, centroid or moment of inertia of the cross-section into a spreadsheet file; and
   export the cross-section type into an Initial Graphics Exchange Specification (IGES) file, and the apparatus being caused to import the plurality of section cuts includes being caused to import the plurality of section cuts using the spreadsheet file and IGES file.

25. The apparatus of claim 19, wherein the apparatus being caused to identify the one or more geometric or inertial properties of the plurality of stiffeners includes being caused to:
   produce a model including a one-dimensional (1D) curve model, two-dimensional (2D) surface model or a combination thereof from a 3D model of the fixed leading edge section of the aircraft wing; and therefrom,
   identify the one or more geometric or inertial properties of the plurality of stiffeners based at least in part on the model including the 1D curve model, 2D surface model or the combination thereof.

26. The apparatus of claim 25, wherein the apparatus being caused to import the plurality of section cuts into the finite element model of the leading edge rib includes being caused to:
   import the plurality of section cuts into the finite element model as exported from the 1D curve model, 2D surface model or the combination thereof, the one or more geometric or inertial properties thereby being based on the model including the 1D curve model, 2D surface model or the combination thereof.

27. The computer-readable storage medium of claim 26, wherein the respective stiffener includes at least a flange and web, and the elements of the finite element model include bar and shell elements respectively representing flanges and webs of the plurality of stiffeners.

\* \* \* \* \*